United States Patent
Walewyns et al.

(10) Patent No.: US 12,546,736 B2
(45) Date of Patent: Feb. 10, 2026

(54) MANUFACTURING PROCESS FOR MULTI-PIXEL GAS MICROSENSORS WITH MULTIPLE SENSING CAPABILITIES

(71) Applicant: Université Catholique de Louvain, Louvain-la-neuve (BE)

(72) Inventors: Thomas Walewyns, Faulx-le-Tombes (BE); Laurent Francis, Grez-Doiceau (BE)

(73) Assignee: Université Catholique de Louvain, Louvain-la-Neuve (BE)

( * ) Notice: Subject to any disclaimer, the term of this patent is extended or adjusted under 35 U.S.C. 154(b) by 889 days.

(21) Appl. No.: 17/760,976

(22) PCT Filed: Sep. 17, 2020

(86) PCT No.: PCT/EP2020/076048
§ 371 (c)(1),
(2) Date: Mar. 16, 2022

(87) PCT Pub. No.: WO2021/053116
PCT Pub. Date: Mar. 25, 2021

(65) Prior Publication Data
US 2022/0299465 A1   Sep. 22, 2022

(30) Foreign Application Priority Data
Sep. 19, 2019  (EP) .................................... 19198415

(51) Int. Cl.
*H01L 21/283* (2006.01)
*G01N 27/12* (2006.01)
(Continued)

(52) U.S. Cl.
CPC ......... *G01N 27/128* (2013.01); *H01L 21/027* (2013.01); *H01L 21/283* (2013.01);
(Continued)

(58) Field of Classification Search
CPC .. G01N 27/126; G01N 27/127; G01N 27/128; G01N 33/0047; H01L 21/027; H01L 21/283; H01L 21/441
See application file for complete search history.

(56) References Cited

U.S. PATENT DOCUMENTS

2010/0264900 A1\* 10/2010 Blackburn ......... G01N 27/4071
73/31.06
2015/0008486 A1   1/2015 Bryant et al.
(Continued)

FOREIGN PATENT DOCUMENTS

EP           1019715 A1      7/2000

OTHER PUBLICATIONS

N. Marchand, T. Walewyns, D. Lahem, M. Debliquy, L. A. Francis, Ultra-Low-Power Chemiresistive Microsensor Array in a Back-End CMOS Process Towards Selective Volatile Compounds Detection and IOT Applications, Electrical Engineering Department, ICTEAM Institute, Universite catholique de Louvain, Louvain-la Neuve, Belgium, 2017.

(Continued)

*Primary Examiner* — Yara B Green
*Assistant Examiner* — Christopher M Roland
(74) *Attorney, Agent, or Firm* — Foster Swift Collins & Smith PC; Mikhail Murshak

(57) ABSTRACT

The present invention relates to a method for manufacturing multi-pixel gas microsensors, wherein each multi-pixel gas microsensor comprises at least a first pixel group having a first sensing material and a second pixel group having a second sensing material different from the first material. The method comprises a first step of providing a wafer substrate and processing the wafer substrate for building a plurality of multi-pixel microsensors having first and second groups of pixels, a second step of selecting sensing materials for each
(Continued)

Figure 1:
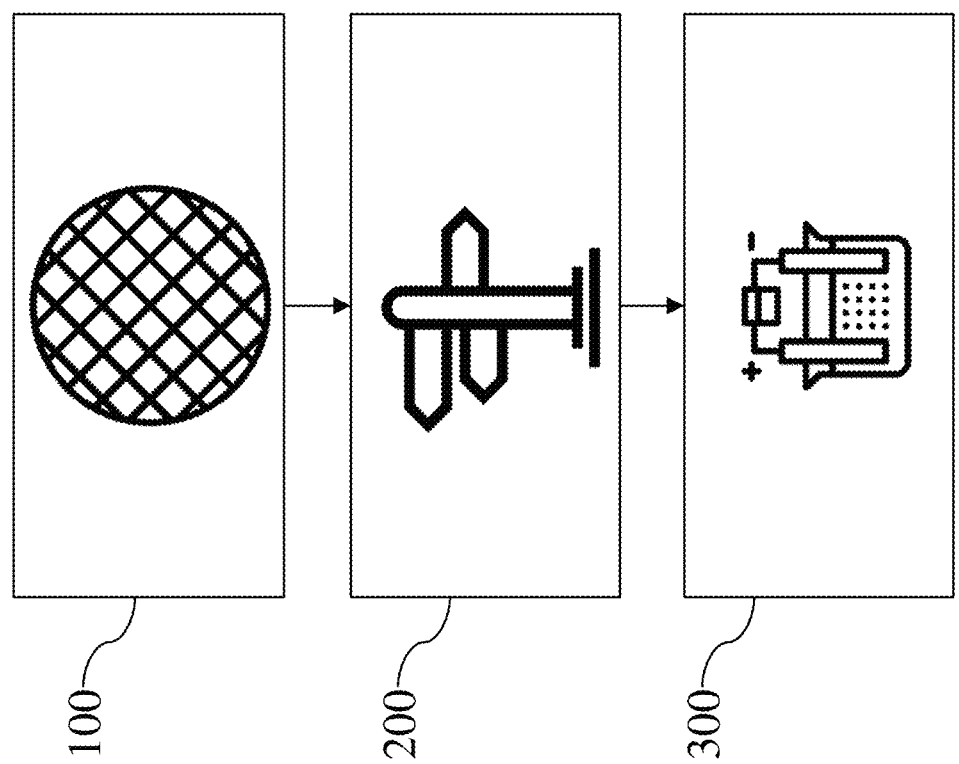

of the groups of pixels, and a third step of activation of the first and the second pixel group by coating electrode pairs of the first and second pixel group with the corresponding sensing materials selected.

15 Claims, 6 Drawing Sheets

(51) Int. Cl.
 *H01L 21/027* (2006.01)
 *H01L 21/441* (2006.01)
 *G01N 33/00* (2006.01)
(52) U.S. Cl.
 CPC .......... *H01L 21/441* (2013.01); *G01N 27/126* (2013.01); *G01N 27/127* (2013.01); *G01N 33/0047* (2013.01)

(56) References Cited

U.S. PATENT DOCUMENTS

| | | | |
|---|---|---|---|
| 2016/0187279 A1* | 6/2016 | Tayebi | G01N 33/0031 |
| | | | 73/31.06 |
| 2018/0106774 A1 | 4/2018 | Ho | |
| 2018/0365559 A1* | 12/2018 | Tayebi | G06N 20/00 |
| 2021/0181145 A1* | 6/2021 | Stowell | B01J 20/28066 |

OTHER PUBLICATIONS

P. Lorwongtragool, E. Sowade, N. Watthanawisuth, R. Baumann, T. Kerdcharoen, a Novel Wearable Electronic Nose for Healthcare Based on Flexible Printed Chemical Sensor Array, Sensors 2014, 14, 19700-19712; doi: 10.3390/s141019700.
International Search Report and Written Opinion, PCT/EP2020/076048, Gabriela Niedermeyr, Sep. 17, 2020.

* cited by examiner

MANUFACTURING PROCESS FOR MULTI-PIXEL GAS MICROSENSORS WITH MULTIPLE SENSING CAPABILITIES

FIELD OF THE INVENTION

The invention is related to a method for manufacturing multi-pixel microsensors with multiple sensing capabilities. More specifically, the invention is also related to a multi-pixel microsensor for detecting gases and/or volatile organic compounds.

BACKGROUND

Seeking for smart environmental monitoring solutions, process control, safety or healthcare applications in the Industry 4.0 and the Internet of Things (IoT), there is a need for low-power and low-cost sensors, especially sensors for detecting the presence/absence and concentration of specific hazardous gases or disease markers, such as volatile compounds.

An example of known environmental sensors are solid-state semiconductor sensors making use of metal oxide surfaces to detect gases. However, these metal oxide gas sensors require high operating temperatures, typically above 200 to 500° C., to activate a surface reaction between the material and the gas to be detected. Therefore, these types of sensors are not well suited in view of their power consumption.

Alternative sensors are sensors making use of polymer- and nanocomposites-based sensor materials. These materials react at room temperature, or below 60° C., allowing therefore to highly reduce the power consumption of the sensor.

However, current sensors using these polymer- and nano-composites-based sensor materials are not manufactured following a mass production process and hence are not always produced in a cost-effective way. Further, depending on the type of gas or environmental parameter to be detected, various sensors need to be manufactured and assembled together for forming a selective sensor array. This further increases manufacturing costs.

Hence, there is room for improving methods for manufacturing sensors with multiple sensing capabilities, especially for sensing gases and volatile compounds.

SUMMARY OF THE INVENTION

It is an object of the present invention to provide a method for manufacturing multi-pixel microsensors with multiple sensing capabilities, especially for sensing gases and volatile compounds. It is a further object to provide a cost-effective manufacturing method by reducing the number of manufacturing steps. More particularly, the method aims for manufacturing low-power microsensors that are compatible with "smart sensor" integration and IoT communication protocols, especially for long-life or battery-less autonomous applications.

The present invention is defined in the appended independent claims. Preferred embodiments are defined in the dependent claims.

According to a first aspect of the invention, a method for manufacturing a plurality of multi-pixel gas microsensors is provided. Each multi-pixel gas microsensor comprises at least one or more pixels having a first sensing material and one or more pixels having a second sensing material different from the first material.

The method comprises steps of:

A) providing a wafer substrate comprising an insulation layer, and processing the wafer substrate for building the plurality of multi-pixel microsensors, the processing comprises at least the steps of:
   A1) creating a lithography mask defining for each of the plurality of microsensors:
      i) one or more first electrode pairs forming a first pixel group, and wherein each first electrode pair comprises a first and a second electrode,
      ii) one or more second electrode pairs forming a second pixel group, and wherein each second electrode pair comprises a third and a fourth electrode,
      iii) a first electrical connecting line connected with each of the first electrodes of the first electrode pairs, and a second electrical connection line connected with each of the second electrodes of the first electrode pairs,
   A2) applying a metallization process to the insulation layer for forming the first electrode pairs, the second electrode pairs, the first electrical connecting line and the second electrical connecting lines in accordance with the lithography mask, and wherein the metallization process comprises depositing one or more layers of metal on the substrate,
   A3) depositing a protecting mask to the substrate, preferably made of nitride or oxide,
B) selecting the first sensing material and the second sensing material, and wherein the first sensing material is a first polymer suitable for electropolymerization,
C) performing an on-wafer activation or an on-die activation of the first and second pixel group, the on-wafer or on-die activation comprising at least steps of:
   C1) locally removing part of the protecting mask that is covering the first electrode pairs of the first pixel group,
   C2) applying a first electropolymerization process for simultaneously coating each of the first electrode pairs of the first pixel group (G1) with the first sensing material, and wherein the first and second electrical connecting lines are used as electrical connections during the first electropolymerization process for applying a first voltage to the first and second electrode or for applying a first voltage difference between the first and second electrode,
   C3) locally removing part of the protecting mask that is covering the second electrode pairs of the second pixel group,
   C4) coating the second electrode pairs of the second pixel group with the second sensing material.

Advantageously, by performing the pixel activation as a separate step, i.e. a back-end step, following a wafer substrate processing defining the groups of electrode pairs, the selection of the sensing materials is independent from this wafer substrate processing. Hence, the various sensing materials can be selected after the wafer substrate processing. This allows for manufacturing an inexpensive customized sensor array. Indeed, with the method according to the invention, an "on-demand" activation of the pixels is performed by covering the electrode pairs with specific sensing materials required for a given application.

Advantageously, by using an electropolymerization process for the activation of pixels with a polymer, a technique is implemented for depositing easily and at low cost the polymer on electrode pairs for forming the pixels. Indeed each of the pixels requiring the same sensing material, i.e. belong to the same pixel group, can be coated simultaneously.

Advantageously, by defining electrical connecting lines for the first electrode pairs and using these inter-connecting lines for applying a first voltage or a first voltage difference during the electropolymerization process, only the first electrode pairs receive the first voltage and hence polymerization is performed in a selective way.

Advantageously, with the method according to the invention, a compact and cheap single chip detector for detecting multiple different gases is obtained.

Advantageously, with the method according to the invention, some groups of pixels can be coated with polymers to sense gases, while other groups of pixels can be coated with other materials suitable to measure for example an on-chip temperature and/or humidity. This allows to compensate signals detected for parasitic effects such as drift or aging.

The method according to the invention is not limited by the specific order of the steps as identified by the sequences of letters such as A), B) and C) or as identified by other sequences of symbols. For example, in embodiments, both the steps C1) and C3) are performed before performing steps C2) and C4). In other embodiments, step B) is for example performed before step A).

In embodiments, the first sensing material and/or the second sensing material is any of the following polymers: polypyrrole, polyaniline, polythiophene or polysilanes compounds. In other embodiments, the first sensing material and/or the second sensing material is a molecularly imprinted polymer.

In embodiments, the method comprises an additional step, following the first electropolymerization process, of cutting the first and the second electrical connection lines such that each first electrode pair of the first group becomes isolated from the other first electrode pairs of the first group.

In embodiments, the first and second electrical connection line are forming a common connection line or wherein the first and the second connection line are interconnected to short-circuit the first and second electrodes such that during the first electropolymerization process the first voltage is a single common voltage for both the first and second electrode, and wherein the method comprises a further step, following the first electropolymerization process of cutting the first and second electrical connection line or cutting the common connection line such that an open-circuit is formed between the first and second electrode for each of the first electrode pairs.

In embodiments, the method according to the invention comprises an additional step, following the first electropolymerization process, of cutting for each microsensor said first and said second electrical connection lines such that each first electrode pair of the first group becomes isolated from the other first electrode pairs of the first group.

In embodiments, for each multi-pixel gas microsensor, the number of pixels having the first sensing material is equal or larger than two. Advantageously, with a detector having multiple pixels with the same sensing material, a more reliable sensing can be performed by for example taking average values or by accumulating data from the various sensors having the same sensing material. Generally, the signal to noise ratio can be improved.

In embodiments according to the invention, the second sensing material is a second polymer suitable for electropolymerization, and wherein the step A1) of providing a lithography mask is further defining: iv) a third electrical connecting line connected with each of the third electrodes of the second electrode pairs, and a fourth electrical connection line connected with each of the fourth electrodes of the second electrode pairs (E2), and wherein the step A2) of metallization is further forming the third and fourth electrical connecting lines, and wherein the step C4) comprises applying a second electropolymerization process for simultaneously coating each of the second electrode pairs of the second group with the second sensing material, and wherein the third and fourth connecting lines are used as electrical connections during the second electropolymerization process for applying a second voltage to the third and fourth electrode or for applying a second voltage difference between the third and fourth electrode.

In further embodiments, also the third and fourth electrical connection line are forming a further common connection line or wherein the third and the fourth connection line are interconnected to short-circuit the third and fourth electrodes such that during the second electropolymerization process the second voltage is applied to both the third and fourth electrode, and wherein the method comprises a further step, following the second electropolymerization process of cutting the third and fourth electrical connection line or cutting the further common connection line such that an open-circuit is formed between the third and fourth electrode for each of the second electrode pairs.

In further embodiments, the method comprises an additional step, following the second electropolymerization process, of cutting the third and the fourth electrical connection lines such that each second electrode pair of the second group becomes isolated from the other second electrode pairs of the second group.

The microsensor that can be obtained with the method according to the invention is not limited to a first and a second pixel group and in embodiments more than two pixel groups are provided by applying for the additional pixel groups the method steps as defined for the first group and/or second group of pixels.

According to a second aspect of the invention, a multi-pixel microsensor for detecting gas and volatile organic compounds is provided that is manufactured according the method as defined in the appended claims.

Advantageously, the combination of several sensing materials, like molecularly imprinted polymers and non-imprinted polymer, on a single device enhances both sensitivity and selectivity, and enables gas discrimination.

Advantageously, the multi-pixel microsensor according to the invention operates at room temperature.

SHORT DESCRIPTION OF THE DRAWINGS

Figure 2:
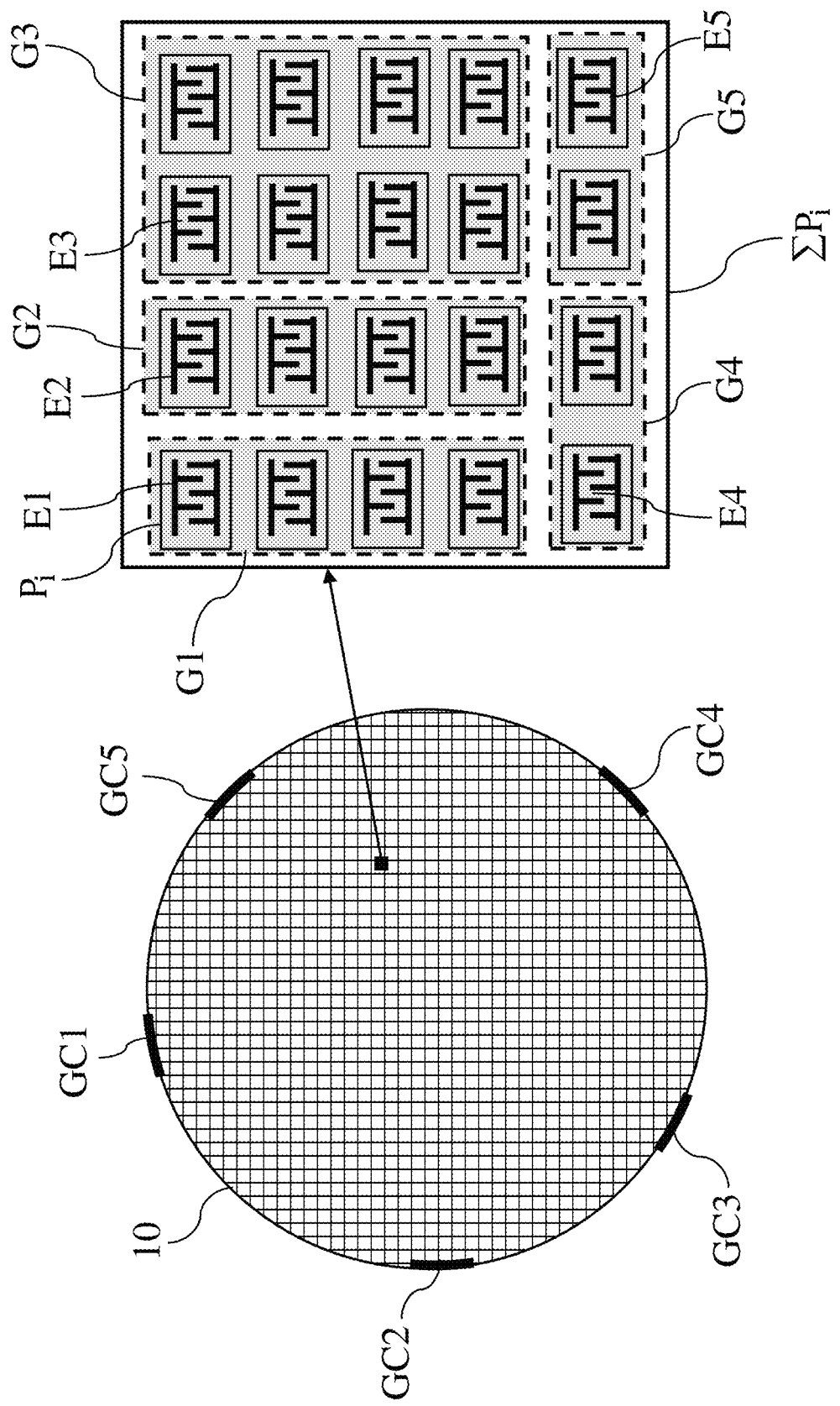
Figure 3:
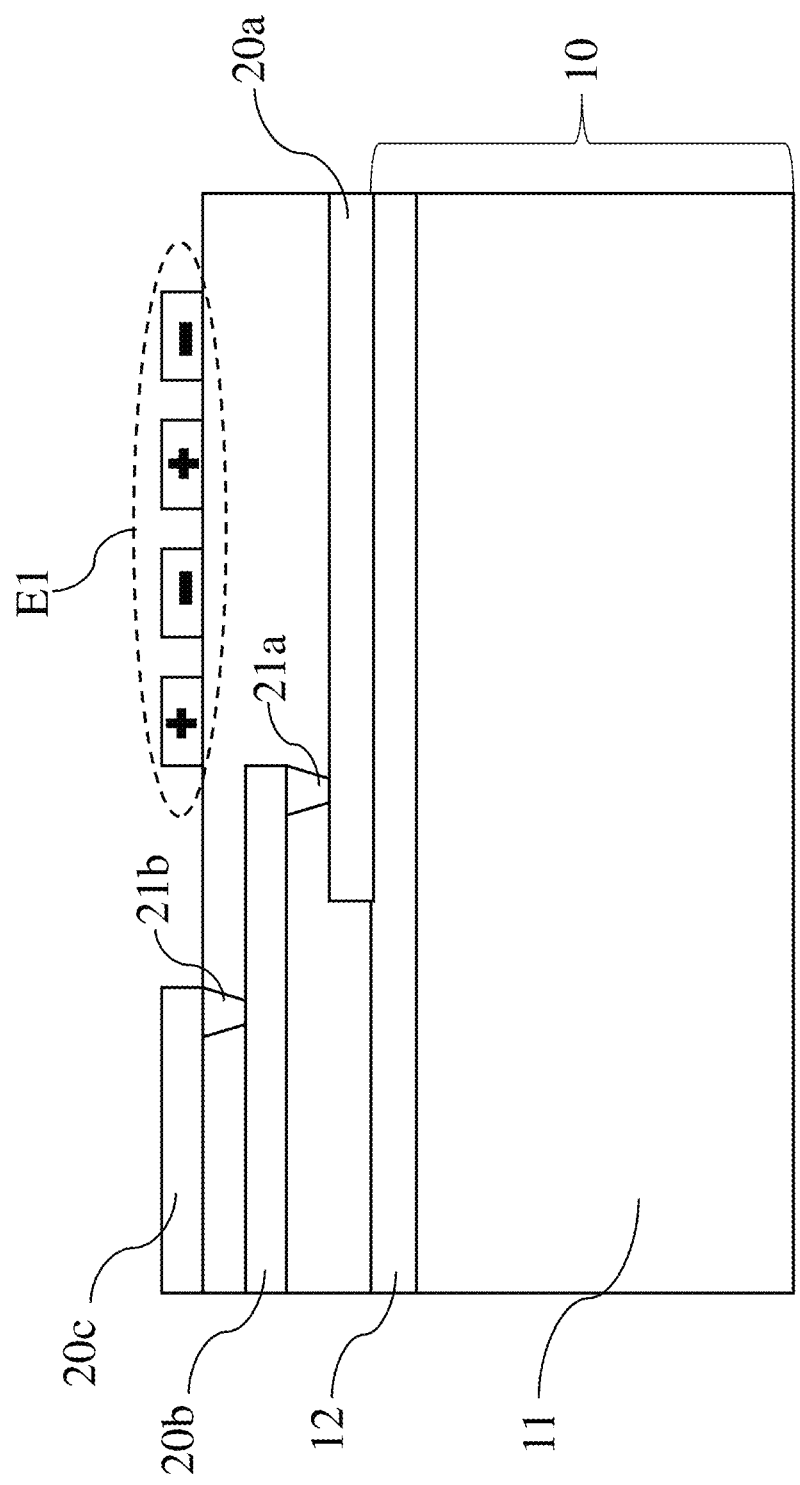
Figure 4:
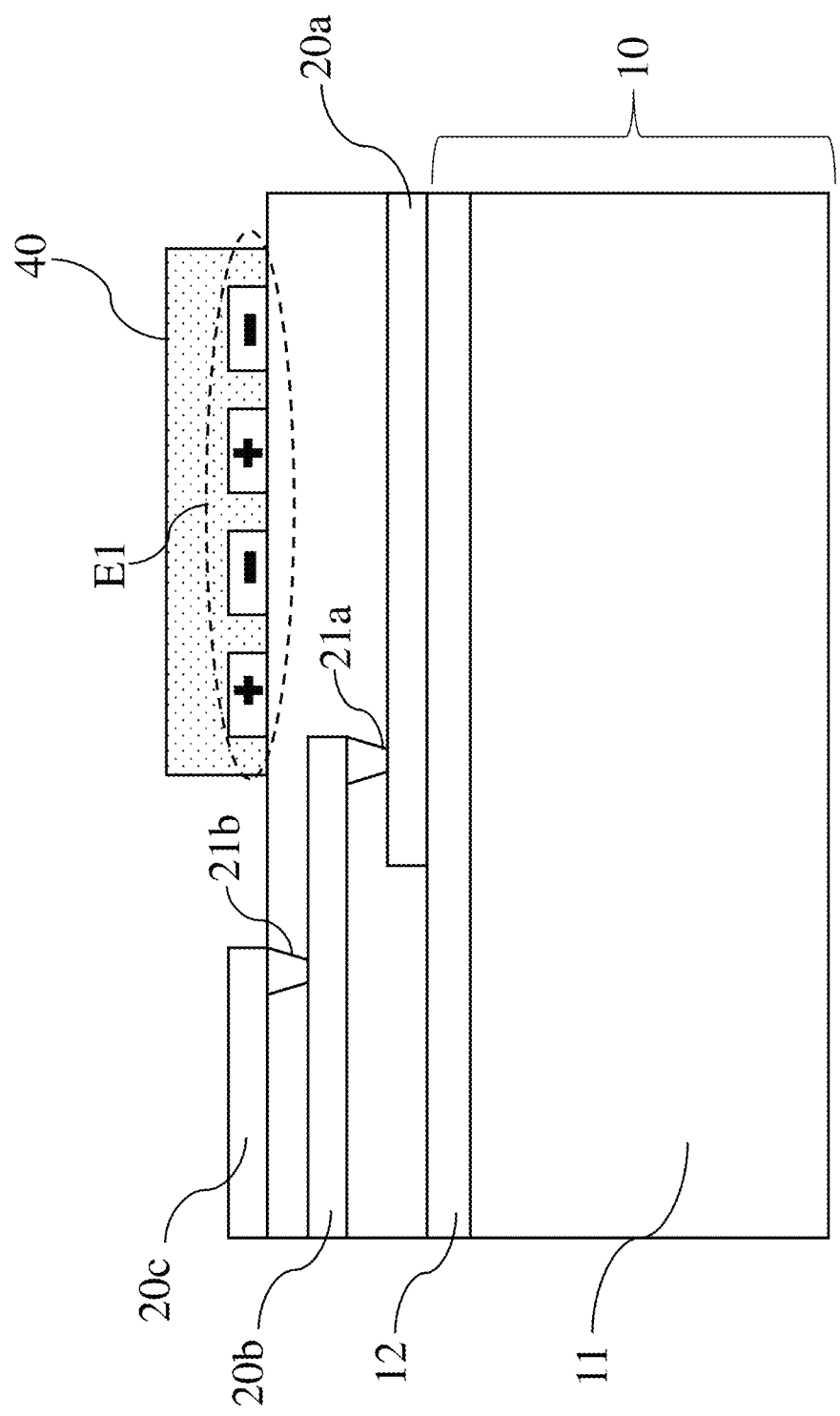
Figure 5:
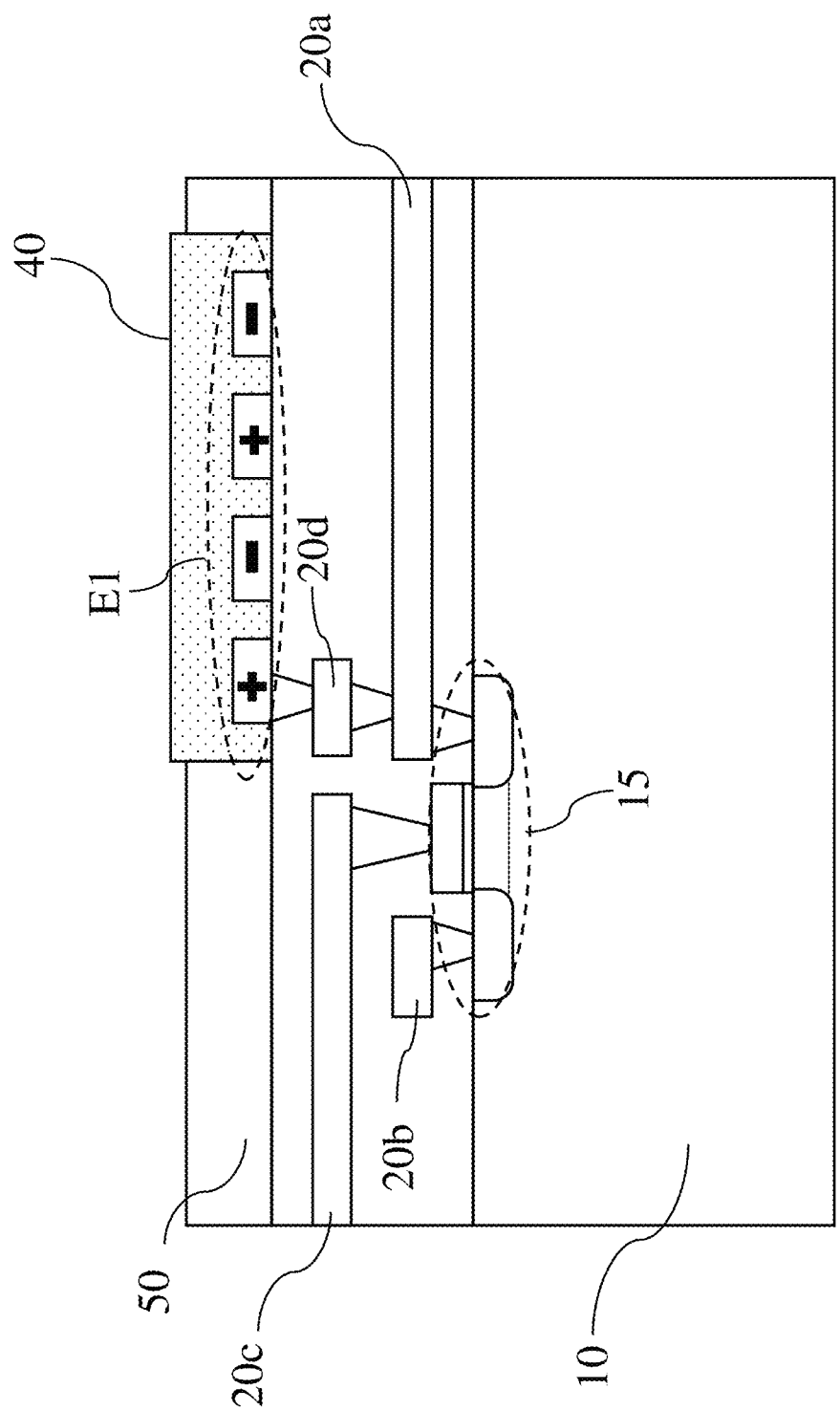
Figure 6:
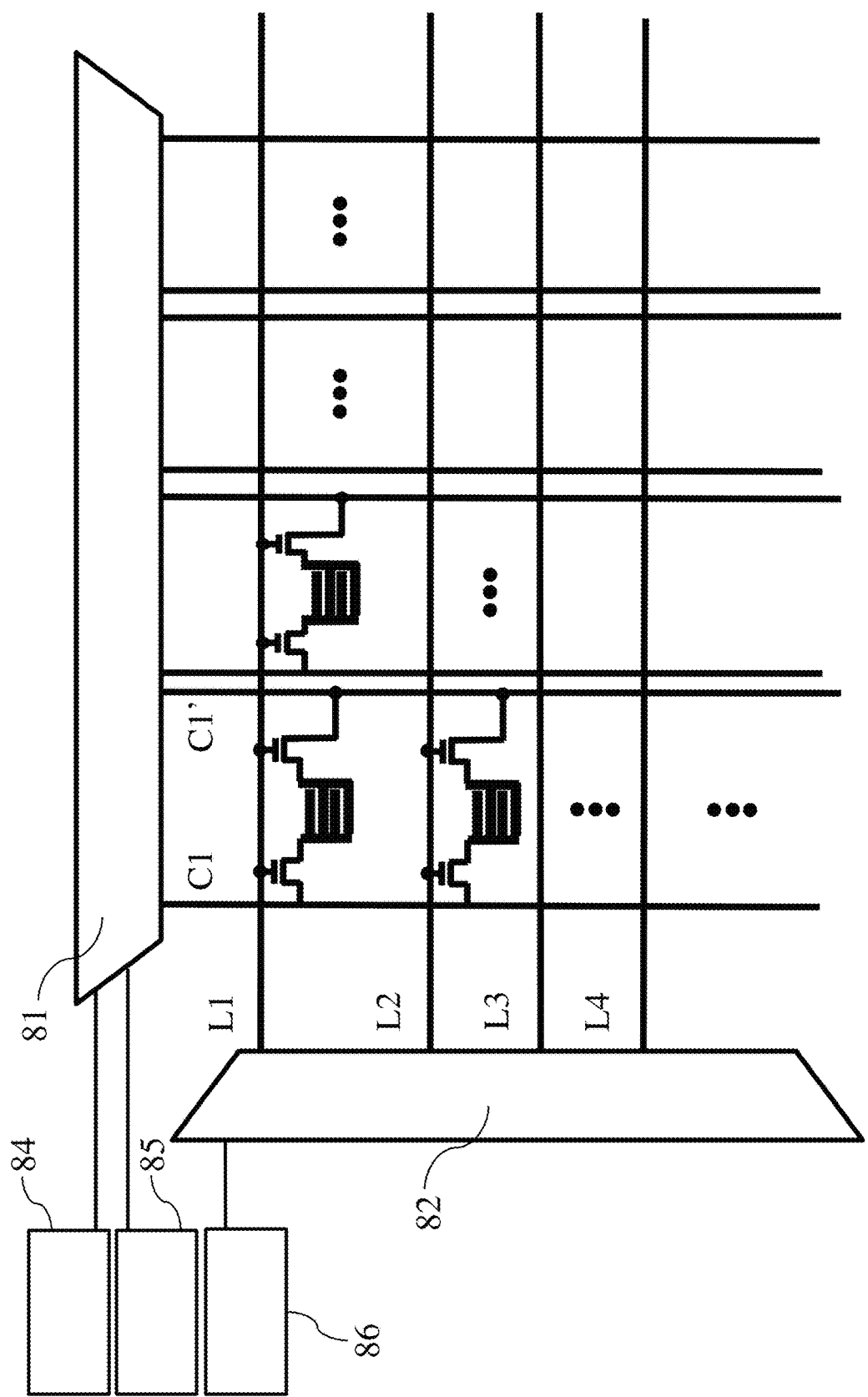

These and further aspects of the invention will be explained in greater detail by way of example and with reference to the accompanying drawings in which:

FIG. 1 represents a flow chart according to an embodiment of the method according to the invention, FIG. 2 represents a top view of a wafer substrate and a magnification of a portion of the wafer substrate illustrating an embodiment of a pixel array resulting from the method according to the invention, FIG. 3 schematically represents a cross-sectional view of an embodiment of a pixel according to the invention before pixel activation, FIG. 4 schematically represents a cross-sectional view of the embodiment of a pixel shown on FIG. 2 after pixel activation, FIG. 5 schematically represents a cross-sectional view of a further embodiment of a pixel of a microsensor according to the invention, FIG. 6 schematically represents a readout device for a microsensor according to the invention.

The figures are not drawn to scale. Generally, identical components are denoted by the same reference numerals in the figures.

DETAILED DESCRIPTION OF PREFERRED EMBODIMENTS

The present disclosure will be described in terms of specific embodiments, which are illustrative of the disclosure and not to be construed as limiting. It will be appreciated by persons skilled in the art that the present disclosure is not limited by what has been particularly shown and/or described and that alternatives or modified embodiments could be developed in the light of the overall teaching of this disclosure. The drawings described are only schematic and are non-limiting.

Use of the verb "to comprise", as well as the respective conjugations, does not exclude the presence of elements other than those stated.

Use of the article "a", "an" or "the" preceding an element does not exclude the presence of a plurality of such elements.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Method for Manufacturing, General

According to a first aspect of the invention a method for mass production of multi-pixel gas microsensors with multiple sensing capabilities is provided.

A multi-pixel microsensor has to be construed as a sensor array composed of multiple pixels and wherein at least a first pixel group has a different sensing capability when compared to a second pixel group of the sensor array. The pixels are sometimes also named transducers. Different sensing capabilities are obtained by using different sensing materials for the pixels. In this way, the microsensor behaves like an "environmental camera", wherein a first pixel group is for example able to detect a first particular gas and a second pixel group is able to measure temperature and/or humidity or a second particular gas, different from the first gas. The multi-pixel microsensor is not limited to the number of different sensing materials used. For example, a third pixel group can comprise a sensing material to detect a further particular gas. For practical reasons, the number of different sensing materials within a microsensor is preferably limited to 25.

A pixel group of a multi-pixel microsensor has to be construed as a grouping of one or more pixels of the microsensor having the same sensing material. For example, in an embodiment of a microsensor, the first pixel group can comprise three pixels having a first sensing material and the second pixel group can comprise one pixel having a second sensing material. In other words, in embodiments, some of the pixel groups can also consist of one pixel.

Each of the multi-pixel gas microsensors manufactured with the method according to the invention comprises at least a first pixel group G1 having a first sensing material and a second pixel group G2 having a second sensing material different from the first material.

The method of manufacturing the multi-pixel microsensor comprises three major steps as schematically illustrated on FIG. 1: a first step 100 of providing a wafer substrate and processing the wafer substrate for building a plurality of multi-pixel microsensors with a first pixel group G1 and with a second pixel group G2, a second step 200 of selecting sensing materials for each of the pixel groups and a third step 300 of activation of the first and the second pixel groups with the selected sensing materials.

The first step 100 according to the method of the invention provides a wafer substrate wherein an outer surface is forming an insulation layer and the wafer substrate is then processed for building the plurality of multi-pixel microsensors. Various examples of wafer substrates suitable for applying the present method will be further discussed below. The processing of the wafer substrate comprises at least the sub-step A1) of creating a lithography mask. The lithography mask is defining for each of the plurality of microsensors: i) one or more first electrode pairs E1 for forming the first group G1 of pixels and wherein each first electrode pair comprises a first and a second electrode, ii) one or more second electrode pairs E2 forming the second pixel group G2 and wherein each second electrode pair comprising a third and a fourth electrode, and iii) a first electrical connecting line connected with each of the first electrodes of the first electrode pairs E1, and a second electrical connection line connected with each of the second electrodes of the first electrode pairs E1. These first and second electrical connecting lines are generally also named interconnecting lines.

The invention is not limited to a specific lithography technique for applying the lithography mask. In embodiments, the lithography mask is for example a light-field mask obtained by photolithography and in other embodiments an electron beam lithography technique is applied or any other suitable lithography technique for applying the mask.

In embodiments, the first electrode of the first electrode pair and the third electrode of the second electrode pair are positive electrodes and the second electrode of the first electrode pair and the fourth electrode of the second electrode pair are negative electrodes.

Remark that the number of electrode pairs per group is not necessarily the same for each group, for example a first group can have four pairs of first electrodes and a second group can have two pairs of second electrode pairs.

In a sub-step A2) a metallization process is applied to the insulation layer of the wafer substrate for forming the first electrode pairs, the second electrode pairs and the first and second electrical connecting lines in accordance with the created lithography mask. This metallization process includes at least deposing one or more layers of metal on the wafer substrate. The metallization process based on lithography is a known process, typically used in the back-end-of-line of an IC manufacturing process. In FIG. 2, a top view of a wafer substrate 10 and a magnification of a portion of the wafer substrate illustrating an embodiment of a pixel array resulting from the processing steps A1) and A2) is shown. In this example, the pixel array $\Sigma P_i$ to form the microsensor comprises five groups of pixels P1, P2, P3, P4, P5. In this example, the total number of pixels $P_i$ in the pixel array is equal to twenty. The group P1 comprises four electrode pairs E1 and the group P2 comprises four electrode pairs E2. The group P3 comprises eight electrode pairs E3. The group G4 comprises two electrode pairs E4 and the group P5 also comprises two electrode pairs. As will be further discussed below, those electrode pairs E1 to E5 can be identical or be different.

To further illustrate the manufacturing process, in FIG. 3, a cross-sectional view of an embodiment of a pixel resulting from the processing steps A1) and A2) is represented. This cross-sectional view shows a first electrode E1 of one pixel built on the wafer substrate 10, and in this embodiment the electrode pair E1 is formed by two interdigitated electrodes. In this exemplary embodiment, the electrical connecting lines of the pixel groups are realized using three metallization layers 20a, 20b and 20c, the layers being inter-connected with a via 21a, 21b. The number of metallization layers required depends on the number of groups of pixels defined. Generally two layers of metal are sufficient if the microsensors to be manufactured only require two different sensing materials. If more different sensing materials are required, more metal layers are provided.

Following the metallization process, in a third sub-step A3) a protecting mask is deposited onto the substrate. In embodiments, this protecting mask is made of nitride or oxide.

In the second step 200 a selection is made of the first sensing material for the first pixel group and the second sensing material for the second pixel group. The first sensing material is a first polymer suitable for electropolymerization. This second step 200 can be construed as a customization decision making step and can be performed either before or after the first step 100.

In the third step 300, the on-wafer activation or an on-die activation is performed of the first and second pixel group. This on-wafer or on-die activation comprising at least the following four steps of:

C1) locally removing part of the protecting mask that is covering the plurality of first electrode pairs of the first pixel group, C2) applying a first electropolymerization process for simultaneously coating each of the first electrode pairs of the first pixel group with the first sensing material, and wherein the first and second electrical connecting lines are used as electrical connections for applying a first voltage to the first electrode pairs during the first electropolymerization process, C3) locally removing part of the protecting mask that is covering the second electrode pairs of the second pixel group, C4) coating the second electrode pairs of the second pixel group with the second sensing material.

In FIG. 4, a cross-sectional view is shown of an embodiment of a pixel resulting from the processing steps C1) and C2). This cross-sectional view illustrates the first electrode E1 being covered with a polymer 40.

In embodiments, both the steps C1) and C3) are performed before performing steps C2) and C4). Indeed, the inventors have observed that locally removing part of the protecting mask for all electrode pairs and subsequently coating the groups of pixels with their proper sensing material does not influence the coating process of each individual pixel group. Advantageously, this reduces the time required to perform the activation of each of the pixel groups.

In alternative embodiments step C3) is only performed after having completed steps C1) and C2).

As discussed above, a microsensor can comprises different sensing materials for sensing different gases. In these embodiments, the second sensing material is for example a second polymer suitable for electropolymerization. The sub-step A1) of providing a lithography mask is then further defining: iv) third and fourth electrical connecting lines connected with respectively the third and fourth electrode of the second electrode pair and the step A2) of metallization is then further forming the third and fourth electrical connecting lines. The step C4) further comprises applying a second electropolymerization process for simultaneously coating each of the second electrode pairs of the second sensing group with the second sensing material. The third and fourth electrical connecting lines are hereby used as electrical connections for applying a second voltage to the second electrode pairs during the second electropolymerization process.

It is appreciated that persons skilled in the art can extend the present method for manufacturing microsensors having more than two different polymers as a sensor material.

In some embodiments, following the activation process, the protecting mask applied in step A3) is entirely removed, e.g. by an etching procedure, while in other embodiments the protecting mask is maintained. In FIG. 5, an example is shown where the protecting mask 50 is maintained.

Wafer Substrate

The wafer substrate provided for performing the method according to the invention has to be construed as any substrate suitable for applying the method steps A1) to A3).

In embodiments, as illustrated on FIG. 3, the wafer substrate 10 comprises at least a first layer 11 made of a semiconducting material such as Si or Ge or made of a metal such as Al, Au, Ag, Pt, and a second layer 12 made of an insulating material. The second insulating layer is forming an external surface of the substrate wafer and is a starting layer for executing the processing steps 100 discussed above.

Typically, the insulation layer 12 of the wafer substrate is formed by any of the following: an oxidation process, a nitriding process, an oxide deposition, or a nitride deposition.

In other embodiments, the wafer substrate comprises a layer made of an insulating material such as glass or quartz. In embodiments, the entire wafer substrate is made of glass or quartz.

In particular embodiments, the wafer substrate provided for performing the method according to the invention is a wafer substrate resulting from an initial front-end-of-line (FEOL) process. For example the wafer substrate can comprise transistors configured for reading out signals generated by the electrode pairs of the microsensors. In the case of on-die activation of the pixels, these transistors can also be used as switches for controlling the polymerization voltage supplied to electrode pair Sensing Materials Various materials can be used as sensing materials for the pixels such as conducting polymers, e.g. molecularly imprinted polymers (MIP) and non-imprinted polymers (NIP), as well as nanocomposites based on for example carbon nanotubes or graphene.

The microsensor resulting from the manufacturing method according to the invention comprises at least a polymer as a first sensing material. In embodiments, a sensing material is any of the following polymers: polypyrrole, polyaniline, polythiophene or polysilanes compounds.

In embodiments, the microsensor comprises a combination of sensor materials wherein a first sensor material is a molecularly imprinted polymer (MIP) and a second sensor material is a non-imprinted polymer (NIP).

In some embodiments, one or more pixel groups can have a membrane as a sensing material, e.g. a membrane made out of graphene. In other embodiments, the sensing material is made of a resistive or a semiconducting material.

As discussed above, the microsensor manufactured according to the present invention comprises at least a first pixel group having a polymer as sensor material and this sensor material is deposited on the first electrode pairs by a first electropolymerization process.

If the microsensor comprises a second pixel group having for example carbon nanotubes, graphene or nanocomposites as a sensing material, then in step C4) of the method according to the invention, one of the following processes is used to deposit the sensing material: spray coating, drop coating or an inkjet printing. These processes are known in the art for applying coatings.

In some embodiments, one or more electrode pairs are not coated, i.e. no sensing material is added between the electrodes of the electrode pairs. These electrode pairs are for example used for resistive measurements without the presence of any coating, for example for the purpose of temperature measurements.

Electrodes

In embodiments, the first electrode pairs and/or the second electrode pairs are formed by two interdigitated electrodes. In alternative embodiments, the first or second electrode pairs are formed by two opposing electrical contacts. Each of the electrode pairs comprises a positive and a negative electrode. The electrodes are for example made out of copper.

In some embodiments, a first pixel group comprises electrode pairs formed by two interdigitated electrodes and a second pixel group comprises electrode pairs formed by two opposing electrical contacts. In other words, the electrode pairs can vary from pixel group to pixel group.

In some embodiments, a conductive element, such as for example a grid made of graphene, is placed between two opposing electrical contacts forming the electrode pair. This allows to increase the distance between the electrical contacts and facilitate the polymerization process. For these embodiments, the method comprises a further step as part of the pixel activation step 300 to couple such a conductive element between the electrodes of an electrode pair.

In embodiments using interdigitated electrodes, when coating with a polymer, the polymer thickness coated to the electrode pair is about 1 to 2 µm thick in order to fully recover the two electrodes of the electrode pair and get ohmic contact.

In other embodiments, the distance between the electrodes of the electrode pair can be smaller than 1 µm, for example a few hundred nanometer. Generally, a smaller distance is more efficient for the electro polymerization process.

The interdigitated electrodes comprise a number of fingers and the number of fingers is optimized as function of the required resistance between the electrodes of the electrode pairs. For example, in embodiments, a required resistance can be in a range between 100 kiloohm and 1 megaohm.

Electrical Connecting Lines

The electrical connecting lines have to be construed as conductors or portions of conductors for interconnecting electrodes of electrode pairs having the same sensing material. The electrical connecting lines are for example made out of copper.

In embodiments, the first electrical connecting lines and the second electrical connecting lines of the first pixel group are interconnected, i.e. the first and second electrodes of the electrode pairs of the first pixel group are forming a short-circuit. In this way, during the first electropolymerization process a first single voltage can be applied to the first and the second electrodes of the first electrode pairs of the first group. This means that for example the positive and negative electrodes are at the same voltage during the electropolymerization process.

In some embodiments, the first and second electrical connection lines are forming a common connection line such that the first and second electrodes of the first electrode pairs are short-circuited by default.

As a consequence, for the embodiments wherein the first electrode pairs are short-circuited as discussed above, the method according to the invention comprises a further step, following the first electropolymerization process, of cutting the first and second electrical connection line or cutting the common connection line such that an open-circuit is formed between the first and second electrode for each of the first electrode pairs.

Similar, if for example the second sensing material is a second polymer, the third and fourth electrical connecting lines are interconnected and forming a further short-circuit. In this way, during the second electropolymerization process a second single voltage can be applied to the third and fourth electrodes of all the second electrode pairs. Hence, also here the positive and negative electrodes are at the same voltage during the second electropolymerization process.

More in general, in some embodiments, wherein the microsensors comprises multiple pixel groups for using multiple polymers as sensing material, each of the electrical conductors of the electrode pairs of each of the pixel groups are configured such that the electrode pairs are short-circuited.

In other embodiments, the first and second electrical connecting lines are forming two separate electrical conductors, i.e. the first electrical conductor connecting for example the positive electrodes of all the first electrode pairs and the second electrical conductor connecting the negative electrodes of all the first electrode pairs. In this way, the first and second electrical connecting lines can be used to apply a first voltage to all positive electrodes and a second voltage to all negative electrodes of the first electrode pairs during the electropolymerization process. In other words, a first voltage difference can be applied between the first and the second electrode.

When the electrode pairs are short-circuited by using a common connecting line or by interconnecting the first and second electrical connection lines as discussed above, the number of metallization layers that needs to be applied during the metallization process is reduced. In this case, with one metallization layer, two different sensor materials can be covered. With two metallization layer for example four different sensor materials can be covered. On the other hand, if the first and second electrodes remain separated by using a dedicated first and second electrical connection line connected to respectively the first and second electrodes, then more metallization layers are needed per sensor material. Then generally one metallization layer is required per sensing material.

On-Wafer Activation of the Pixels

The activation of the pixels can either be performed on the level of the wafer, i.e. "on-wafer" or on the level of a die, i.e. "on-die" after dicing the wafer.

In embodiments wherein the activation of the first and second pixel group is performed on-wafer, the sub-step C2) of applying a first electropolymerization process is performed simultaneously for each first pixel group of the plurality of multi-pixel microsensors sustained by the wafer substrate. The simultaneous electropolymerization on-wafer is performed by placing the wafer substrate, following processing of steps A1) to A3), in a first electrolyte solution and applying the first voltage to the first and second electrode pairs if the first and second electrode are short-circuited or applying a voltage difference between the first and second electrode if the first and second electrode are not short-circuited. As mentioned above, the first and second electrical connection lines are used as electrical connections for applying voltages to the electrodes.

When the activation of the pixels is to be performed on-wafer, the wafer substrate, before executing the processing steps A1) to A3), is provided with global electrical contacts GC1, GC2 at the periphery of the wafer which allow to connect the voltage supply providing the voltage for performing polymerization process. In these embodiments, as part of the metallization step A2), the first and second electrical connecting lines of each of the microsensors are being connected with one or two global electrical contacts at the wafer periphery. If the multi-pixel sensor to be manufactured comprises a plurality of groups each having a different polymer sensing material, then for each pixel group requiring a polymer sensing material, one or two global electrical contacts are provided at the periphery of the wafer.

In the embodiment shown on FIG. 2, five global contacts GC1 to GC5 on the wafer substrate are shown which allow to coat the five groups of pixels G1 to G5 with different polymer sensing materials. The number of global contacts required on the wafer substrate depends on the number of pixel groups requiring a polymer as sensing material. If in the example shown on FIG. 2, only groups G1 to groups G3 would require to be coated through a polymerization process, then three global contacts on the wafer could be sufficient.

In some embodiments, as part of the metallization process a number of first electrical connecting lines of multiple microsensors are connected with each other and the number of second electrical connecting lines of these multiple microsensors are also connected with each other. These connected first electrical connecting lines and connected second electrical connecting lines are then connected with a single or with a pair of global contacts at the periphery of the wafer. In this way the total number of global contacts at the periphery of the wafer per sensing material can be strongly reduced. In some embodiments, only one or a few global contacts are required per sensing material.

As discussed above, for each microsensor, the first electrodes of the first electrode pairs E1 of the first group G1 are interconnected through the first electrical connecting line and the second electrodes of the first electrode pairs E1 of the first group G1 are interconnected through the second electrical connecting line. Therefore, for embodiments wherein the activation is performed on-wafer, following said first electropolymerization process, the method comprises an additional step, namely cutting, for example by an etching process, said first and said second electrical connection lines such that each first electrode pair E1 of the first group G1 becomes isolated from the other first electrode pairs of the first group G1. Indeed, each electrode pair together with its sensor material is forming an independent pixel sensor. When the microsensor is operational, each pixel sensor is to acquire signals and transfer signals to a reading device independently from any signal detected in another pixel sensor.

On-Die Activation of the Pixels

For embodiments wherein the activating of the first and second pixel group is performed on-die, the method comprises an additional step of dicing of the wafer before performing step C), i.e. executing the on-die activation of the first and second pixel group.

For these embodiments wherein the pixel activation is performed on-die, the wafer substrate provided in step A) is resulting from an initial front-end-of-line process. As part of this front-end-of-line process, a pair of transistors for each first electrode pair of the first pixel group is provided. Advantageously, these transistors of the first electrode pairs are used as switches allowing to control the first voltage during the first electropolymerization process. Those transistors 15 are for example NMOS or PMOS transistors. In FIG. 5 a cross-sectional view is shown of a pixel wherein the wafer substrate 10 was resulting from an initial front-end-of-line process wherein the pair of transistors for each electrode pair is provided. On FIG. 5, one transistor 15 is shown together with electrical connecting lines 20a to 20d.

In embodiments, the die is packaged and the resulting chip comprises a plurality of peripheral connecting pads. Some of these pads are electrically connected with the pair of transistors of the first pixel group and allow to control the first voltage during the first polymerization process.

When the activation of the first electrode pairs is performed on-die, the polymerization process used in step C2) is a droplet polymerization process or a dedicated microfluidic process. With a droplet polymerization process a droplet comprising the polymerisation liquid is supplied on top of the pixel having the protecting mask locally removed. When a microfluidic system is used, a fluid is circulated for example through a small chamber above the pixels, such that the pixels having the protecting mask locally removed become in contact with the fluid.

Multi-Pixel Microsensor

According to a second aspect of the invention a multi-pixel microsensor for detecting gas and/or volatile organic compounds is provided. The multi-pixel microsensor according to the invention is obtained by a manufacturing method as discussed above involving the manufacturing steps 100, 200 and 300 as schematically illustrated on FIG. 1.

The die corresponding to a single microsensor can have an overall surface dimension that can vary from embodiment to embodiment. For example, in embodiments, the die corresponding to a single microsensor has a typical overall surface dimension of $1 \times 1$ mm$^2$, or $0.5 \times 0.5$ mm$^2$ or less. In other embodiments, this dimension can be larger and have values up to for example $3 \times 3$ mm$^2$. The surface dimension of a single pixel of a microsensor can vary from embodiment to embodiment. In some embodiments, the pixel size is for example $10 \times 10$ μm$^2$. In other embodiments the pixel size can be much larger, for example if a larger area microsensor is to be used, then the pixel size of this microsensor can even go up to $1 \times 1$ mm$^2$.

In embodiments wherein a pair of transistors for each first electrode pair of the first pixel group is provided as part of an initial front-end-of-line process of the wafer substrate, the transistors can also be used to control the readout process of the detectors. The readout process applied is for example performed through multiplexing, in a similar way as in known CMOS cameras, followed by a resistive and/or a capacitive readout.

In FIG. 6, an embodiment is shown wherein a multiplexer is coupled with a microsensor according to the invention, wherein the readout can be performed for each pixel, and wherein the coating of electrode pairs by electropolymerization can also be selectively performed during the manufacturing process of the microsensor. The system shown in FIG. 6 comprises a column decoder 81, and a line decoder 82. The line decoder is coupled with a control box 86 which allows to activate one of the lines of the line decoder, for example one of lines L1, L2, L3, L4 as shown on FIG. 6. As schematically shown on FIG. 6, each of these lines is coupled with a number of gates of the pair of transistors associated to a pixel. A writing controlling device 84 and a reading controlling device 85 are coupled with the column decoder 81. The writing controlling device 84 is used during the electropolymerization process to selectively apply a voltage to the pixels requiring electropolymerization. For example, if line L1 is activated through the control box 86 then the writing controlling device 84 can for example set voltages to column C1 and column C1' that are adequate for the electropolymerization process if the pixel located on Line L1 and column C1/C1' requires electropolymerization. In this way, the electropolymerization process can be selectively applied and controlled pixel per pixel. Depending on the type of electropolymerization process used, the voltages applied on for example C1 and C1' can be equal or different.

As discussed above, when the activation of the pixels of a microsensor is completed and the microsensor becomes operational, then the column and line decoders and associated controls shown on FIG. 6 can be used to selectively readout data from each of the pixels, for example through a resistive and/or a capacitive readout. As an example, if line L1 is activated, the data from the pixel located on line L1 and column C1/C1' can be read out by the reading controlling device 85 through the column connections C1 and C1'.

The invention claimed is:

1. A method for manufacturing a plurality of multi-pixel gas microsensors, wherein each multi-pixel gas microsensor comprises at least one or more pixels having a first sensing material and one or more pixels having a second sensing material different from the first material, the method comprising:
A) providing a wafer substrate (10) comprising an insulation layer (12), and processing said wafer substrate for building the plurality of multi-pixel microsensors, said processing comprises at least steps of:
  A1) creating a lithography mask defining for each of the plurality of microsensors:
   i) one or more first electrode pairs (E1) forming a first pixel group (G1) corresponding to the first sensing material, and wherein each first electrode pair comprises a first and a second electrode,
   ii) one or more second electrode pairs (E2) forming a second pixel group (G2) corresponding to the second sensing material, and wherein each second electrode pair comprises a third and a fourth electrode, and
   iii) a first electrical connecting line connected with each of the first electrodes of the first electrode pairs (E1), and a second electrical connection line connected with each of the second electrodes of the first electrode pairs (E1),
  A2) applying a metallization process to said insulation layer for forming, for each of the plurality of microsensors, said first electrode pairs, said second electrode pairs, said first electrical connecting line and said second electrical connecting lines in accordance with the lithography mask, and wherein said metallization process comprises depositing one or more layers of metal on the substrate, and
  A3) depositing a protecting mask to the substrate, preferably made of nitride or oxide,
B) selecting said first sensing material and said second sensing material, and wherein said first sensing material is a first polymer suitable for electropolymerization, and
C) performing an on-wafer activation or an on-die activation of the first (G1) and second (G2) pixel group, said on-wafer or on-die activation comprising at least the steps of:
  C1) locally removing part of the protecting mask that is covering the first electrode pairs (E1) of the first pixel group (G1),
  C2) applying a first electropolymerization process for simultaneously coating each of the first electrode pairs (E1) of the first pixel group (G1) with said first sensing material, and wherein said first and second electrical connecting lines are used as electrical connections during said first electropolymerization process for applying a first voltage to said first and second electrode or for applying a first voltage difference between said first and second electrode,
  C3) locally removing part of the protecting mask that is covering the second electrode pairs (E2) of the second pixel group (G2), and
  C4) coating the second electrode pairs (E2) of the second pixel group with said second sensing material.

2. A method according to claim 1, characterized in that said wafer substrate comprises at least:
a first layer (11) made of a semiconducting material such as Si or Ge or made of a metal such as Al, Au, Ag, Pt, and
a second layer forming said insulation layer (12), and wherein said insulation layer (12) is formed by any of the following: an oxidation process, a nitriding process, an oxide deposition, or a nitride deposition.

3. A method according to claim 1, characterized in that said wafer substrate comprises a layer made of an insulating material such as glass or quartz.

4. A method according to claim 1 characterized in that both the steps C1) and C3) are performed before performing steps C2) and C4).

5. A method according to claim 1 characterized in that, for each of said microsensors, said first and second electrical connection line are forming a common connection line or in that the first and the second connection line are interconnected to short-circuit the first and second electrodes such that during said first electropolymerization process said first voltage is a single common voltage for both the first and second electrode, and in that the method comprises a further step, following said first electropolymerization process of cutting the first and second electrical connection line or cutting the common connection line such that an open-circuit is formed between the first and second electrode for each of the first electrode pairs.

6. A method according to claim 1 characterized in that the activation of the first pixel group (G1) and second pixel group (G2) is performed on-wafer, and wherein sub-step C2) of applying a first electropolymerization process is performed simultaneously for each first pixel group of the plurality of multi-pixel microsensors by placing the wafer substrate in a first electrolyte solution.

7. A method according to claim 6, further comprising an additional step of steor following said first electropolymerization process, of cutting said first and said second electrical connection lines such that each first electrode pair (E1) of the first pixel group (G1) becomes isolated from the other first electrode pairs of the first pixel group (G1).

8. A method according to claim 1, characterized in that the activating of the first pixel group (G1) and second pixel group (G2) is performed on-die and in that the method comprises an additional step of dicing of said wafer before performing said on-die activating of the first pixel group (G1) and second pixel group (G2), and in that the wafer substrate provided in step A) is resulting from an initial front-end-of-line process comprising a step of forming a pair of transistors (15) for each first electrode pair (E1) of the first pixel group (G1), and in that said transistors of the first electrode pairs are used as switches allowing to control said first voltage or said first voltage difference during the first electropolymerization process.

9. A method according to claim 1 characterized in that said first sensing material is selected from the group consisting of any of the following polymers: polypyrrole, polyaniline, polythiophene or polysilanes compounds, or in that said first sensing material is a molecularly imprinted polymer.

10. A method according to claim 1 characterized in that said second sensing material is made of a material selected from the group consisting of: carbon nanotubes, graphene, nanocomposites, and combinations thereof.

11. A method according to claim 1 characterized in that said second sensing material is made of a resistive or a semiconducting material.

12. A method according to claim 1 characterized in that said second sensing material is coated to the second electrode pairs by using a spray coating, a drop coating or an inkjet printing process.

13. A method according to claim 1, characterized in that said second sensing material is a second polymer suitable for electropolymerization, and in that said step A1) of providing a lithography mask is further defining: iv) a third electrical connecting line connected with each of the third electrodes of the second electrode pairs (E2), and a fourth electrical connection line connected with each of the fourth electrodes of the second electrode pairs (E2), and in that said step A2) of metallization is further forming said third and fourth electrical connecting lines, and in that said step C4) comprises applying a second electropolymerization process for simultaneously coating each of the second electrode pairs (E2) of the second group (G2) with said second sensing material, and in that said third and fourth connecting lines are used as electrical connections during said second electropolymerization process for applying a second voltage to said third and fourth electrode or for applying a second voltage difference between said third and fourth electrode.

14. A method according to claim 1 characterized in that said first electrode pairs and/or said second electrode pairs are formed by interdigitated electrodes or are formed by two opposing electrical contacts.

15. A multi-pixel microsensor for detecting gas and/or volatile organic compounds obtained by a manufacturing method according to claim 1.

* * * * *